United States Patent
Sicurella et al.

(10) Patent No.: US 7,528,654 B2
(45) Date of Patent: May 5, 2009

(54) ANALOG TRANSCONDUCTANCE AMPLIFIER

(75) Inventors: Giovanni Sicurella, Mascalucia (IT); Manuela La Rosa, Giarre (IT); Donata Rosaria Nicolosi, Catania (IT)

(73) Assignee: STMicroelectronics, S.r.l., Agrate Brianza (MI) (IT)

( * ) Notice: Subject to any disclaimer, the term of this patent is extended or adjusted under 35 U.S.C. 154(b) by 79 days.

(21) Appl. No.: 11/753,126

(22) Filed: May 24, 2007

(65) Prior Publication Data

US 2007/0290759 A1    Dec. 20, 2007

(51) Int. Cl.
*H03F 3/45* (2006.01)
(52) U.S. Cl. .............................. 330/253; 330/257; 330/9
(58) Field of Classification Search .................. 330/253, 330/257, 9
See application file for complete search history.

(56) References Cited

U.S. PATENT DOCUMENTS

| | | | | |
|---|---|---|---|---|
| 5,612,614 | A * | 3/1997 | Barrett et al. | 323/316 |
| 6,194,959 | B1 * | 2/2001 | Kamoshida et al. | 327/552 |
| 6,680,643 | B2 * | 1/2004 | Conte et al. | 327/539 |
| 6,791,390 | B2 * | 9/2004 | Gay | 327/332 |
| 7,061,309 | B2 * | 6/2006 | Kato et al. | 327/553 |
| 7,345,543 | B2 * | 3/2008 | Barou et al. | 330/257 |
| 2005/0277240 | A1 | 12/2005 | Fix et al. | 438/200 |

FOREIGN PATENT DOCUMENTS

JP    2006013108    1/2006

\* cited by examiner

*Primary Examiner*—Patricia Nguyen
(74) *Attorney, Agent, or Firm*—Allen, Dyer, Doppelt, Milbrath & Gilchrist, P.A.

(57) ABSTRACT

An analog transconductance amplifier includes an input stage including a first transistor and a second transistor connected in series to the first transistor. The first and second transistors are connected between positive and negative voltages and are respectively controlled by an input voltage and a first control voltage for generating a normalized drive voltage. An amplification stage includes a first conduction path including an amplification transistor controlled by the normalized drive voltage. A first load transistor is connected in series to the amplification transistor and is controlled by a second control voltage. A second conduction path includes at least one second load transistor controlled by a third control voltage. A current mirror forces through the second conduction path a replica of current flowing through the first conduction path. An output stage transistor delivers an output current, and is controlled by a voltage on the second load transistor. All of the transistors in the analog transconductance amplifier are field effect transistors of a same conductivity type.

14 Claims, 9 Drawing Sheets

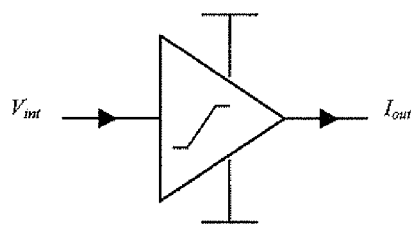
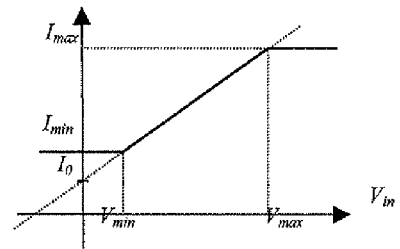
FIG. 1A          FIG. 1B
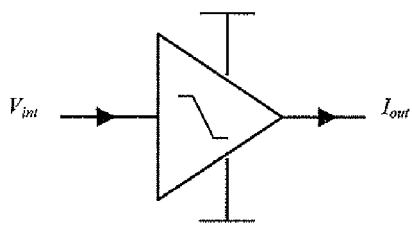
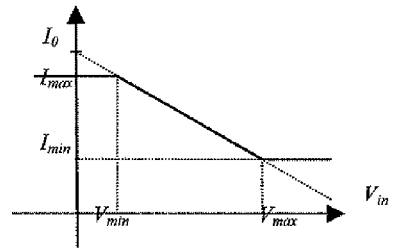
FIG. 2A          FIG. 2B
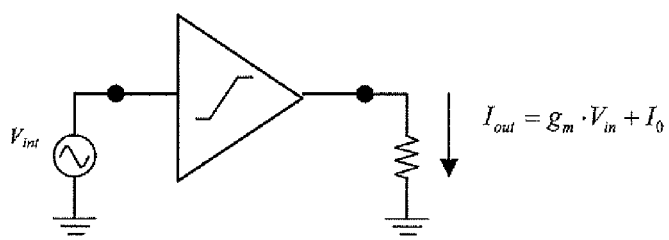
FIG. 3A
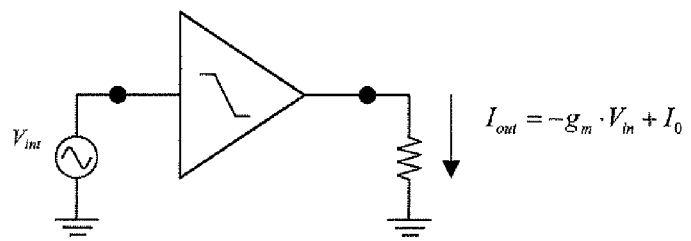
FIG. 3B

ANALOG TRANSCONDUCTANCE AMPLIFIER

FIELD OF THE INVENTION

The invention relates to transconductance amplifiers, and more particularly, to a transconductance amplifier formed using only organic P-type transistors.

BACKGROUND OF THE INVENTION

Properties of organic semiconductors have been studied in a search for new types of active electronic devices, such as polymeric transistors TFT (Thin Film Transistor). Polymeric deposition techniques are intrinsically low cost, relatively simple and compatible with substrates of flexible plastic or glass. These techniques allow electronic devices to be obtained with new and useful characteristics that cannot be found in devices obtained with current technologies using silicon.

Many different models of organic transistors are available [References 1-6]. In semiconductor circuits formed on silicon substrates, both N-type transistors and P-type transistors are normally present. Thus, it should be possible theoretically to form electronic circuits with organic transistors using the same electrical schemes that are used with transistors defined on silicon by simply substituting silicon P or N-type transistors with organic P or N-type transistors. Unfortunately, this is not currently possible because there are no organic N-type transistors having adequate stability and with a sufficiently large mobility of the carriers [References 11-13].

As a consequence, the present circuit schemes in CMOS technology cannot be used for forming circuits with organic transistors because these transistors may be only of P-type conductivity. Several architectures of logic gates and of simple logic circuits (ring oscillators, flip-flops, multiplexers and demultiplexers) that use OTFT (Organic Thin Film Transistor) are disclosed [Reference 7]. U.S. published patent application no. 2005/0277240 discloses architectures of logic gates of this kind made with organic field effect transistors.

Analog electronic circuits formed with organic transistors are much less frequently discussed in the literature. Japanese published patent application no. 2006,013108 discloses architectures of logic gates and of an analog amplifier that use only organic P-type transistors. The architecture of the analog amplifier is the classic architecture of a two-stage source follower The drawbacks of such an architecture are its high complexity, and the fact that it uses resistors instead of load transistors.

SUMMARY OF THE INVENTION

In view of the foregoing background, an object of the invention is to a transconductance analog amplifier comprising only organic P-type transistors.

This provides an architecture alternative to that disclosed in the above-referenced Japanese patent application that requires less transistors and does require bias resistors.

Though the novel architecture can be implemented even with MOSFET silicon transistors, they are particularly advantages when implemented with organic transistors. Organic transistors have reduced fabrication costs and are compatible with flexible plastic.

The transconductance amplifiers may have a linear-saturated voltage-current characteristic and may substantially comprise an input configuration stage that may have either a common source or a common drain receiving an input voltage signal and a first control voltage for establishing the offset of the input signal. An amplification stage may be controlled by two other control voltages that determine a linear saturated transfer characteristic, and an output stage for delivering an output current with a practically a null output impedance.

The amplifiers may be used for forming Chua's circuits for studying nonlinear oscillators.

BRIEF DESCRIPTION OF THE DRAWINGS

FIG. 1a is the symbol of the device according to the invention;

FIG. 1b shows the ideal transfer characteristic of the device according to the invention;

FIG. 2a is the symbol of a nonlinear analog amplifier having a transfer characteristic with a negative slope according to the invention;

FIG. 2b shows the ideal transfer characteristic of the amplifier of FIG. 2a;

FIG. 3a and 3b depict connections to a load of the amplifiers of FIGS. 1a and 2a;

DETAILED DESCRIPTION OF THE PREFERRED EMBODIMENTS

The transconductance analog amplifier substantially functions as a current generator controlled by the input voltage. When the input voltage varies in a certain interval, current variations are proportional to variations of the input voltage by the transconductance value gm. When the input voltage exits the specified interval, the output current reaches a saturation level.

In the analog amplifier, voltage and current ranges may be configured by the users. Even the modulus and the sign of the slope of the trans-characteristic may be designed for obtaining positive or negative gains.

For a better understanding, a brief description of the ideal characteristics of organic analog amplifiers will now be discussed. The symbol of the analog amplifier and the ideal transfer characteristic for a transconductance amplifier with positive slope characteristics are depicted in FIGS. 1a and 1b, respectively.

The output current Iout is tied to the input voltage Vin through the following relations:

$$I_{out} = \begin{cases} g_m \cdot V_{in} + I_0 & se \ V_{min} \leq V_{in} \leq V_{max} \\ I_{min} & se \ V_{in} < V_{min} \\ I_{max} & se \ V_{in} > V_{max} \end{cases}$$

$$\text{with } \begin{aligned} I_{max} &= g_m \cdot V_{max} + I_0 \\ I_{min} &= g_m \cdot V_{min} + I_0 \end{aligned}$$

wherein gm is the transconductance and $I_0$ is the offset current. The input impedance is ideally infinite and prevents circuits coupled to the input nodes of the amplifier from influencing its transfer characteristic. A virtually null output impedance ensures a functioning characteristic such as that of a controlled current generator.

FIGS. 2a and 2b depict the symbol of the analog amplifier having a trans-characteristic with a negative slope and the relative ideal trans-characteristic. In this case, input/output equations are:

$$I_{out} = \begin{cases} -g_m \cdot V_{in} + I_0 & se \ V_{min} \leq V_{in} \leq V_{max} \\ I_{max} & se \ V_{in} < V_{min} \\ I_{min} & se \ V_{in} > V_{max} \end{cases}$$

$$\text{with } \begin{aligned} I_{min} &= -g_m \cdot V_{max} + I_0 \\ I_{max} &= -g_m \cdot V_{min} + I_0 \end{aligned}$$

When the input voltage Vin is in a certain interval, the analog amplifier operates as a linear transconductance amplifier, and the output current Iout depends linearly from the input voltage Vin, as schematically shown in FIG. 3 for an amplifier with positive or negative slope characteristics.

Figure 4:
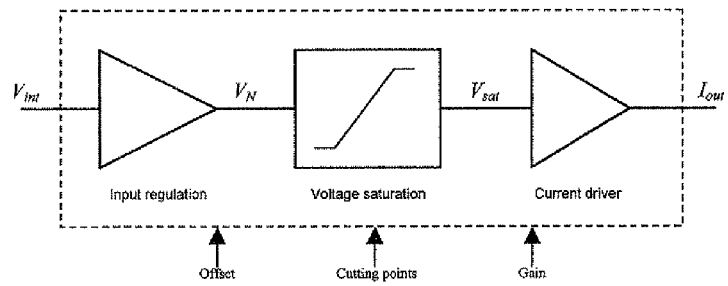
FIG. 4 depicts three functional blocks that compose an analog amplifier according to the invention.

The analog amplifier may be ideally split in three blocks, as shown in FIG. 4. The input stage of the analog amplifier basically establishes the input offset voltage. That is, it establishes the minimum voltage in the range of input voltages inside which the amplifier operates as a transconductance amplifier. This input stage may invert the input voltage for implementing a negative slope trans-characteristic.

The amplification stage, immediately downstream to the input stage, is input with a normalized input voltage $V_N$ and provides the corresponding output voltage Vsat. By fixing the voltages Vmax and Vmin it is possible to establish the range of the input voltage inside which the amplifier operates according to a linear trans-characteristic. The amplitude of the output voltage Vsat may be fixed by the user.

The output stage substantially converts the output voltage Vsat in an output current Iout. This prevents a load of the analog transconductance amplifier from influencing its functioning.

Figure 5:
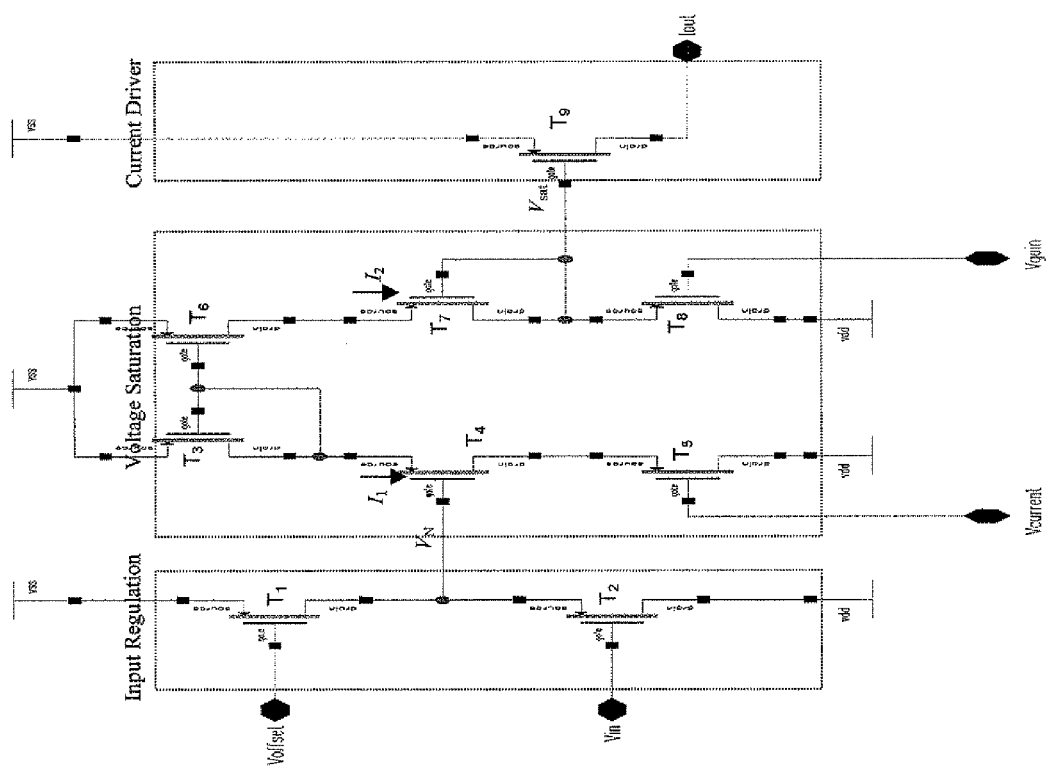
FIG. 5 depicts a detailed circuit scheme of an analog amplifier according to the invention.

FIG. 5 depicts a first circuit embodiment of the analog amplifier composed exclusively of organic P-type transistors. It may be observed that the amplifier depicted in FIG. 5 is formed with only nine P-type transistors while the amplifier in the above-referenced Japanese patent application is composed of fourteen transistors and seven resistors.

The voltages Vss and Vdd are the positive and negative supply voltages, respectively. The voltage Voffset establishes the input offset voltage. The voltage Vin is the input voltage. The current Iout is the output current. The voltage Vgain fixes or sets the slope of the voltage-current characteristic, while the voltage Vcurrent establishes the smallest saturation value of the output current.

The input stage, composed of the transistors T1 and T2, is substantially a common drain or common source amplification stage that provides a high input impedance, and by imposing the constant voltage Voffset, it determines the operating point of the amplifier. The output of this first block is the normalized voltage $V_N$.

When the input signal Vin is applied to the gate of the transistor T2 and the voltage Voffset is applied to the gate of the transistor T1, the slope of the transfer characteristic of the amplifier is positive (common drain). Vice-versa, when the input signal Vin is applied to the gate of the transistor T1 and the voltage Voffset is applied to the gate of the transistor T2, the transfer characteristic of the amplifier is negative (common source).

The amplification stage produces the nonlinear trans-characteristic of the circuit. When the normalized voltage $V_N$ is applied, the amplification stage generates a voltage Vsat that is proportional to the input voltage in the linear part of the trans-characteristic. The transistor T4 operates as a switch. If the normalized voltage $V_N$ is small (close to Vdd) the transistor T4 is on and the supply voltage establishes the current $I_1$ that flows through the loads T3 and T5. The value of the current $I_1$ is established by the constant voltage Vcurrent applied to the gate of the transistor T5.

When the normalized voltage $V_N$ is high (close to the value Vss), the transistor T4 is off and no current circulates ($I_1$=0). When the normalized voltage $V_N$ assumes an intermediate value, the transistor T4 operates in its saturation region, thus the current $I_1$ depends only on the normalized voltage $V_N$. In this operating region, the relation between the current $I_1$ and the normalized voltage $V_N$ may be considered approximately linear.

Figure 6:
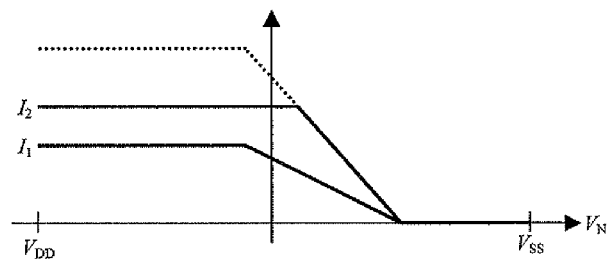
FIG. 6 is a graph showing current characteristics of the analog amplifier of FIG. 5.

The current $I_1$ is amplified by the current mirror composed of the transistors T3 and T6, that establishes the current $I_2$ on the other branch. The nonlinear characteristic of $I_2$ is magnified by the transistor T6 that, as depicted in FIG. 6, establishes the normalized voltage value $V_N$ beyond which the current $I_2$ decreases. This point depends on the load applied by transistors T7 and T8.

The dimensions of the load transistors are set for reducing or minimizing this effect. Moreover, the control input Vgain determines the conductivity of the load. This architecture adjusts the voltage divider composed of the transistors T7 and T8, and as a consequence, the voltage Vsat.

It is then necessary for an output current stage because the nonlinearity of the current $I_2$ depends strongly from the load transistors of the conduction path in which it circulates. A control voltage Vgain applied to the gate of the transistor T8 establishes the amplitude of the voltage Vsat by modifying the conductivity of the load transistor T8.

The voltage Vsat is applied to the output stage for obtaining the output current Iout independently from the load supplied by the amplifier. This output stage is implemented by the transistor T9, connected in an open drain configuration.

The architecture depicted in FIG. 5, should it be composed of silicon MOSFETs (that is, not of organic field effect transistors), would be much less convenient than the common CMOS architectures of analog amplifiers. The outstanding effectiveness of the architecture of FIG. 5 is tied to the fact that it requires only P-type field effect transistors, and thus it can be realized with organic transistors.

In order to simulate the functioning of the circuit of FIG. 5, a mathematical model of an organic P-type transistor has been used by using the Universal Mobility Law in a Variable Range Hopping charge transfer model. Moreover, as suggested in [8-9], also the peculiar characteristics of the organic transistors of P-type have been considered. The circuit of FIG. 5 has been simulated by using the toolbox ELDO and XELGA of the Mentor Graphics™ (Cadence Unicad™).

Figure 7A:
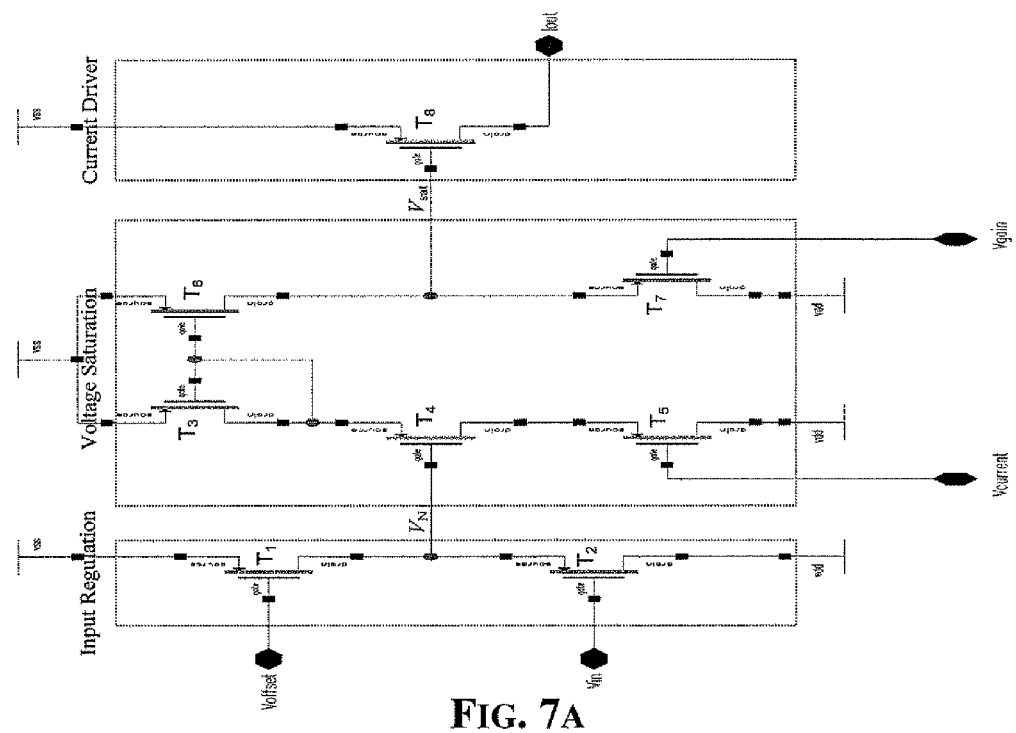
FIGS. 7a and 7b depict alternative architectures of the analog amplifier of FIG. 5.
Figure 7B:
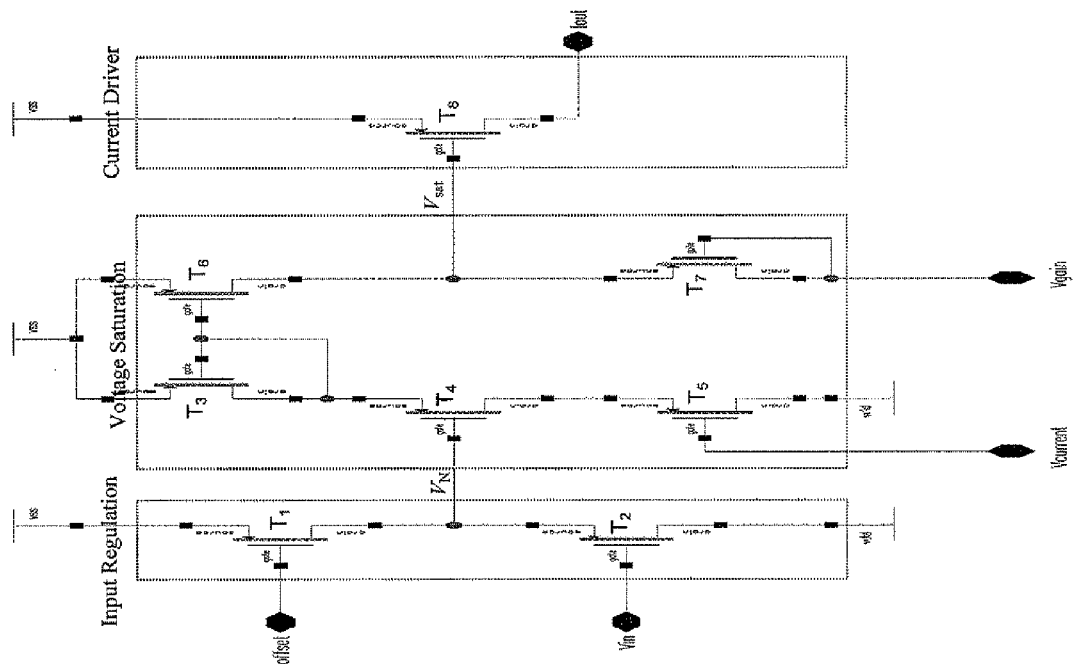

Alternative circuit embodiments to that of FIG. 5 are depicted in FIGS. 7a and 7b. In both cases the input stage is identical to that of FIG. 5. The only differences being the number of load transistors in series to the transistor T6, and in the way in which these transistors are connected.

A characteristic of the amplifier of FIG. 7a includes that the voltage range of the linear region of the trans-characteristic (Vmax-Vmin) is larger than that of the amplifier of FIG. 5. This embodiment is useful for obtaining a block having a linear trans-characteristic for certain values of the input voltage.

In the embodiment of FIG. 7b, the value of the transconductance gain is increased. The control voltage Vgain is applied to the gate and to the drain of the load transistor T7. This configuration allows varying of the slope of the trans-characteristic by modifying the voltage drop on the nodes of the load transistor T7. This is instead of modifying the conductivity of the transistor T7 as in the architecture of FIG. 7a, The amplifier of FIG. 7b may be used for limited input voltage ranges.

By resuming, the trans-characteristic may be determined by the control voltages Voffset, Vgain and Vcurrent, while it is possible to obtain a trans-characteristic with a positive or a negative slope by inverting the roles of the voltages Voffset and Vin.

All the depicted architectures of amplifiers are characterized by a practically null current absorption, since the input voltage Vin is always applied to the gate of a field effect transistor. This is while the output current Iout is substantially independent, within certain limits, from the voltage drop on the supplied loads. The transistor T9 is kept in a conduction state by the load voltage.

Figure 8A:
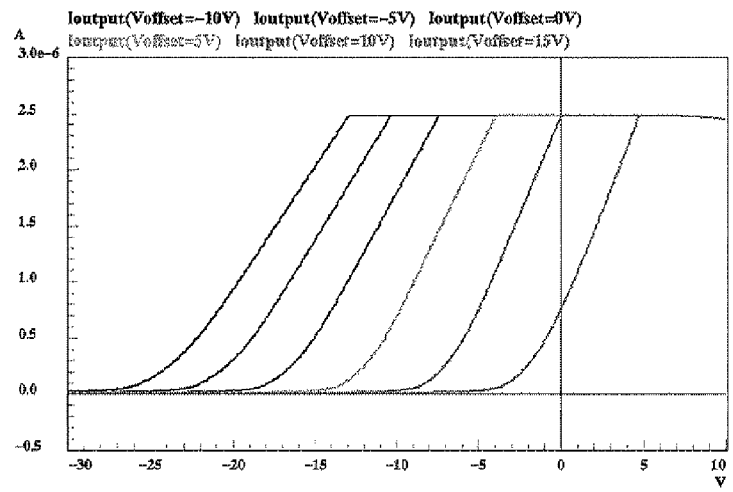
FIGS. 8a, 8b and 8c are graphs of the output current of the amplifier of FIG. 5 with a positive slope trans-characteristic for different values of the control voltages Voffset, Vgain and Vcurrent, respectively.
Figure 8B:
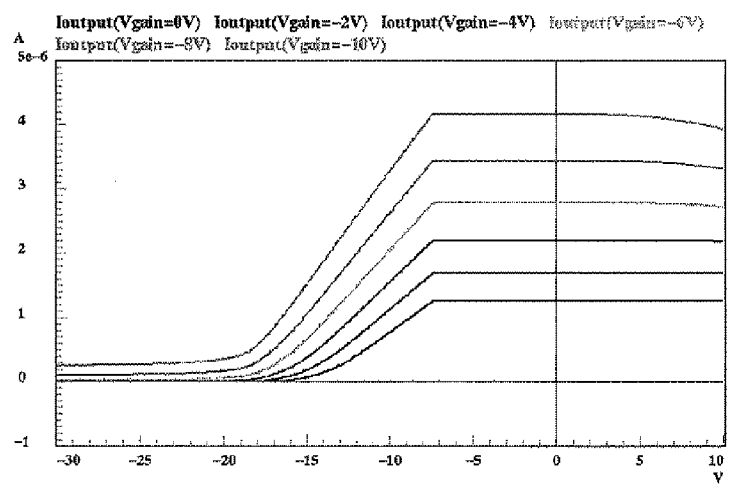
Figure 8C:
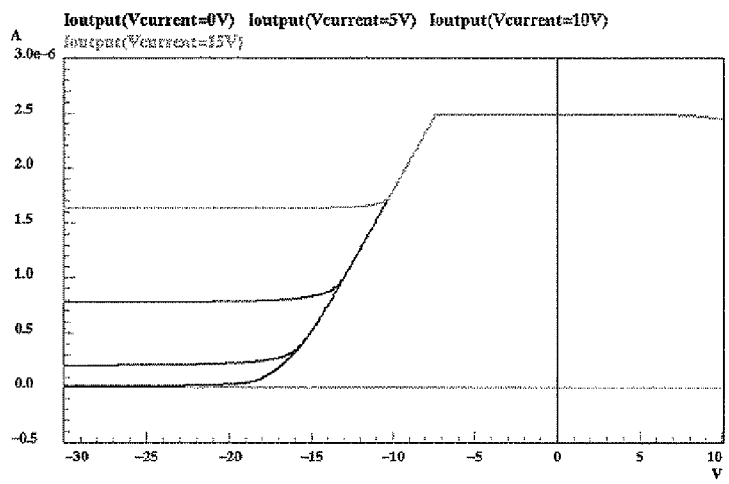
Figure 9A:
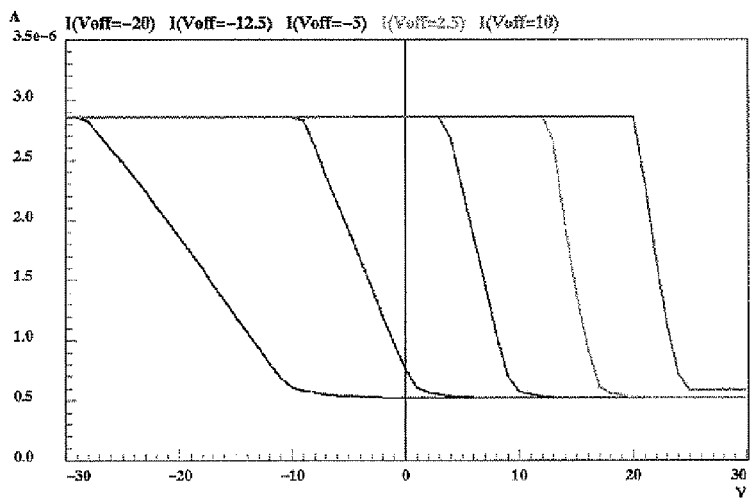
FIGS. 9a, 9b and 9c are similar output current graphs for an analog amplifier with a negative slope trans-characteristic according to the invention.
Figure 9B:
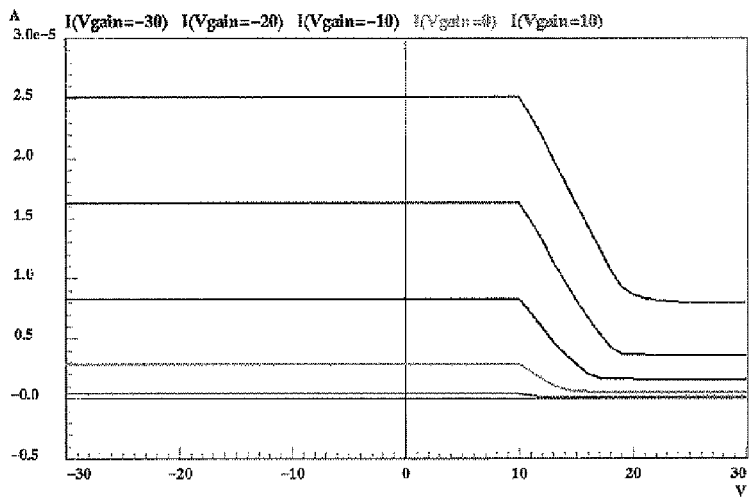
Figure 9C:
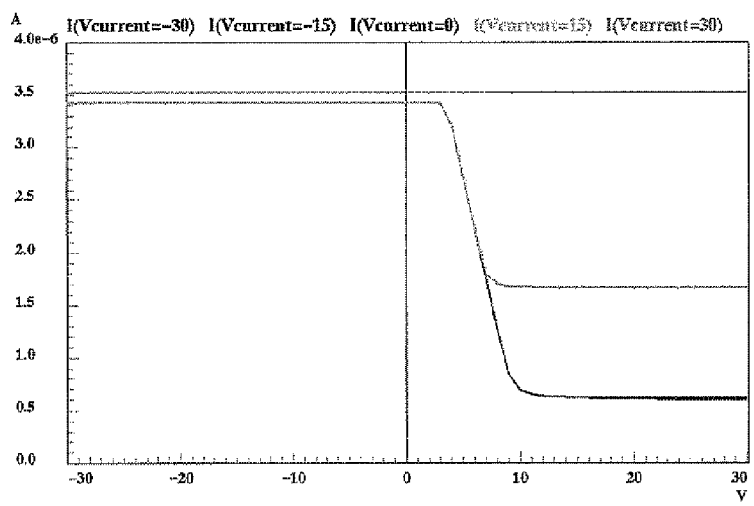

The functioning characteristics of the amplifier of FIG. 5 for different values of the control voltages Voffset, Vgain and Vcurrent are depicted in FIGS. 8a, 8b and 8c, respectively. FIGS. 9a, 9b and 9c depict graphs similar to that of FIGS. 8a, 8b and 8c, in case of exchanging the nodes to which the voltages Voffset and Vin are applied, in order to obtain a negative slope trans-characteristic.

Figure 10A:
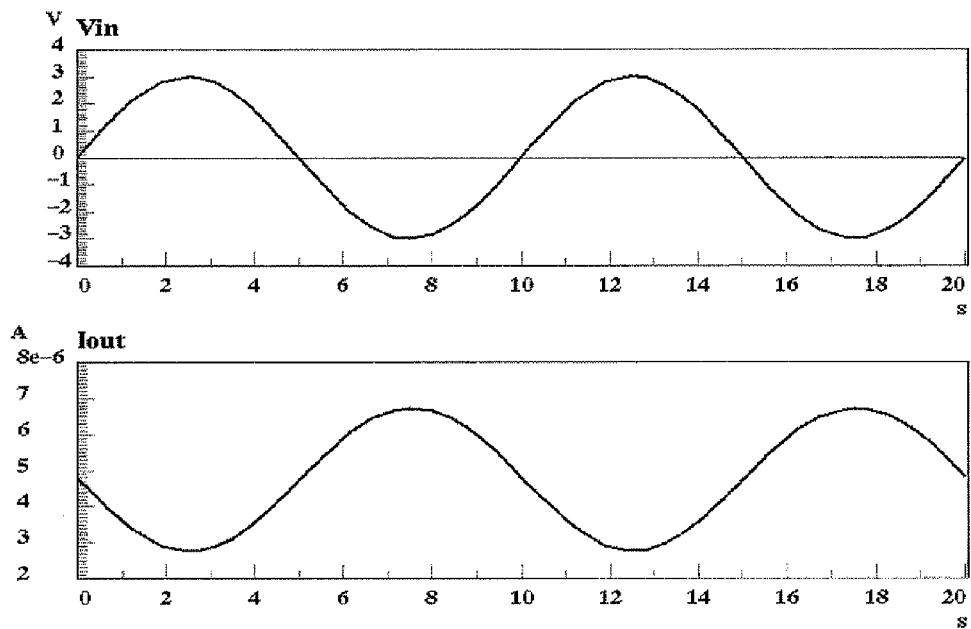
FIGS. 10a and 10b are timing diagrams of voltage and current for an analog amplifier with a negative or a positive slope trans-characteristic, respectively, according to the invention.
Figure 10B:
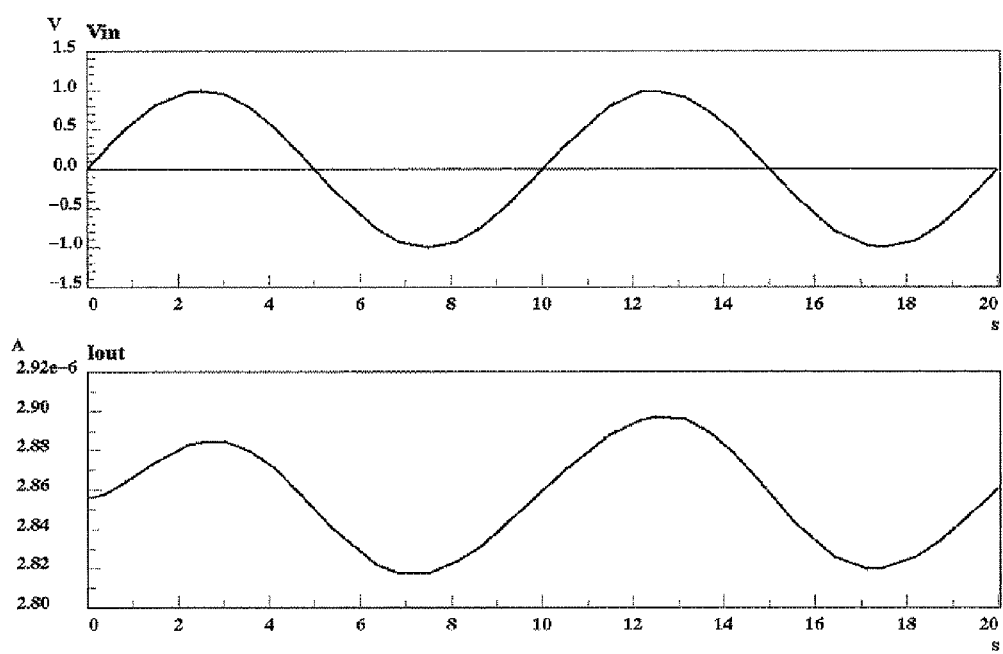

Possible waveforms of the output current as a function of two different input voltages are depicted in FIGS. 10a and 10b for a transconductance characteristic with a negative and a positive slope, respectively. The analog amplifier may be used in a wide variety of circuits. For example, it may be used for realizing a nonlinear oscillator such as the well known Chua's circuit [Reference 10], according to the circuit scheme as depicted in FIG. 11.

For the above discussed reasons, the existing Chua's circuits cannot be implemented with organic field effect transistors because there are no N-type transistors of adequate stability and with a sufficiently large mobility of carriers. This practical impediment is overcome by the circuit depicted in FIG. 11 that is composed entirely of P-type transistors and transconductance amplifiers.

Figure 11:
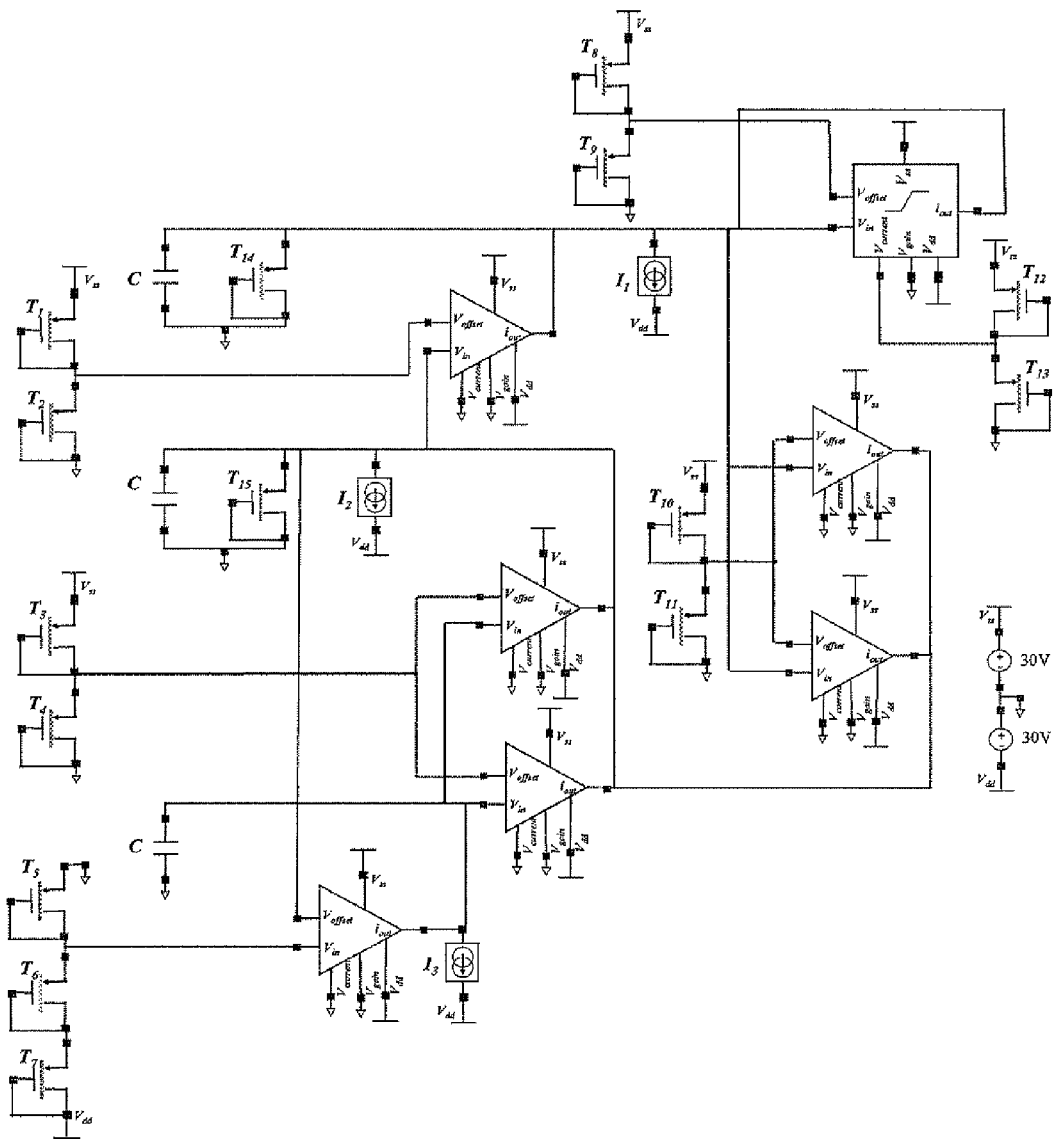
FIG. 11 is a diagram of a Chua's circuit formed with organic P-type transistors and analog amplifiers according to the invention.
Figure 12A:
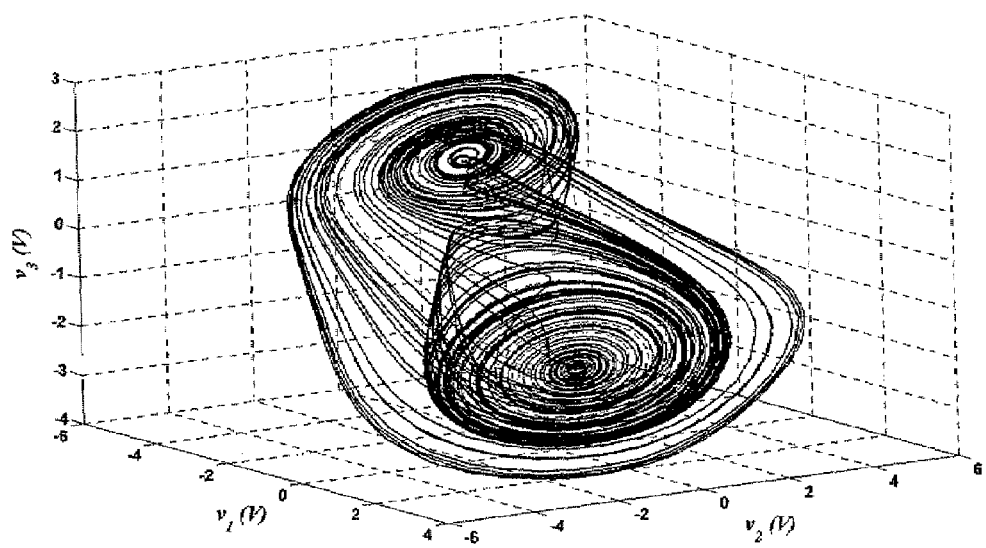
FIGS. 12a and 12b depict phase portraits of the Chua's circuit of FIG. 11 for a chaotic functioning and a periodic functioning, respectively.
Figure 12B:
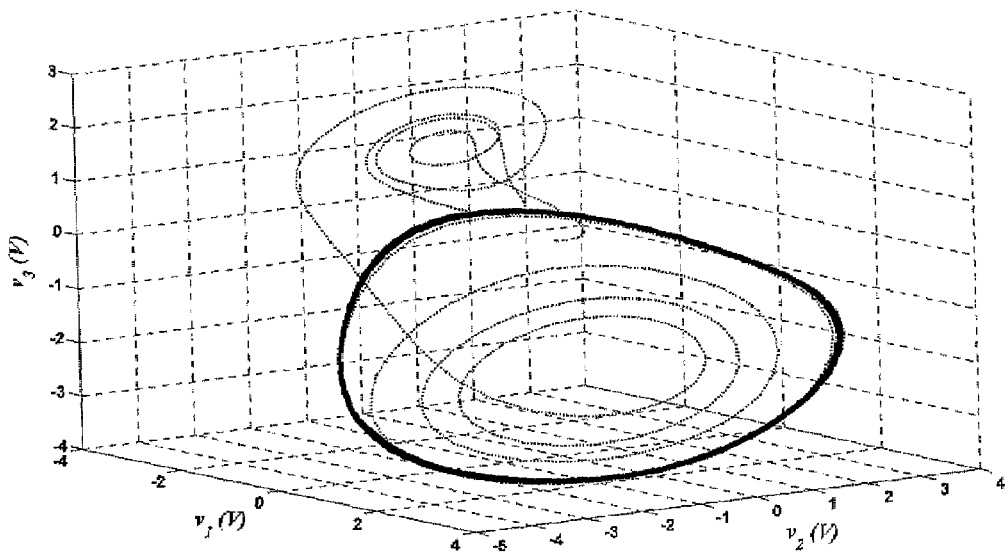

The system of FIG. 11 has been simulated for verifying its functioning as a classic Chua's circuit. FIG. 12 depicts the evolution in the phase space of the oscillator of FIG. 11 in case of a chaotic evolution (FIG. 12a) wherein the presence of two attractors is evident, and in the case of periodic functioning (FIG. 12b).

Even if the architectures are always referred to an implementation with organic P-type field effect transistors, they could of course be realized even with classic P-type field effect transistors, that is, formed on silicon. However, this option would remain less preferred because the performances in this case will be inferior as compared to amplifiers formed in CMOS technology.

REFERENCES

[1] P. V. Necliudov, M. S. Shur, D. J. Gundlach and T. N. Jackson, Modeling of organic thin film transistors of different designs, Journal of applied Physics, 88, 11 (2000).

[2] L. Torsi, A. Dodabalapur, and H. E. Katz, An analytical model for short-channel organic thin-film transistors, AT&T Bell Laboratories, New Jersey. (1995).

[3] M. Jamal Deen, Mehdi H. Kazemeini, Yaser M. Haddara, Jianfei Yu, George Vamvounis, Steven Holdcroft, William Woods. Electrical Characterization of Polymer-Based FETs Fabricated by Spin-Coating Poly(3-alkylthiophene)s. IEEE Transactions on electron devices, 51, 11 (2004).

[4] C. D. Dimitrakopoulos, J. Mascaro, Organic thin film transistors: a review of recent advances. BM J. Res. & Dev. 45, (2001).

[5] C. Dimitrakopoulos, S. Purushothaman, J. Kymissis, A. Callegari, J. M. Shaw, Low-Voltage Organic Transistors on Plastic Comprising High-Dielectric Constant Gate Insulators, Science, 283, 822 (1999).

[6] G. Horowitz, M. E. Hajlaoui, R. Hajlaoui. "Temperature and gate voltage dependence of hole mobility in polycrystalline oligothiophene thin film transistors", Laboratoire des Materiaux Moleculaires, CNRS, Thiais, France (1999).

[7] H. Klauk, D. J. Gundlach and T. N. Jackson, Fast Organic Thin-Film Transistor Circuits, IEEE electron device letters, 20, 6 (June 1999).

[8] A. R. Brown, D. M. Leeuw, E. E Havinga, A. Pomp, A universal relation between conductivity and field effect mobility in doped amorphous organic semiconductors, Synth. Mat. 68, 65 (1994).

[9] R. Brown, C. P. Jarrett, D. M. de Leeuw, M. Matters, Synth. Metals, 88, 37 (1997).

[10] Madan, R. N., Ed, Chua's Circuit: A paradigm for Chaos, World Scientific Series on Nonlinear Science Series B, Vol. 1, World Scientific, Singapore, (1993).

[11] C. Huang, J. E. West, H. E. Katz, Organic field-effect transistors, inverters and logic circuits on gate electrets, Mater. Res. Soc. Symp Proc, Vol 889, 2006.

[12] D. J. Gundlach, K. P. Pernstich, G. Wilckens, M. Grüter, S. Haas and B. Batlogg, High mobility n-channel organic thin-film transistors and complementary inverters, Journal of Applied Physics 98 064502 (2005).

[13] C. D. Dimitrakopoulos and D. J. Mascaro, Organic thin-film transistors: a review of recent advances, IBM J. Res. & Dev. Vol. 45, No. 1, January 2001.

That which is claimed:

1. An analog transconductance amplifier comprising:
   an input stage comprising a first transistor and a second transistor connected in series to said first transistor, said first and second transistors connected between positive and negative voltages and being respectively controlled by an input voltage and a first control voltage for generating a normalized drive voltage;
   an amplification stage comprising
      a first conduction path comprising an amplification transistor being controlled by the normalized drive voltage, and a first load transistor connected in series to said amplification transistor and being controlled by a second control voltage, a second conduction path comprising at least one second load transistor being controlled by a third control voltage, a current mirror for forcing through said second conduction path a replica of current flowing through said first conduction path;

an output stage transistor for delivering an output current based on the input voltage, and being controlled by a voltage on said second load transistor; and said first and second transistors, said amplification transistor, said first load transistor, said at least one second load transistor, and said output stage transistor each comprising a field effect transistor of a same conductivity type.

2. The amplifier of claim 1, wherein said second load transistor comprises a diode-connected transistor.

3. The amplifier of claim 1, wherein said second conduction path further comprises a third diode-connected load transistor connected in series to said second load transistor.

4. The amplifier of claim 1, wherein each transistor comprises an organic P-type field effect transistor.

5. A Chua's circuit comprising:
an analog amplifier comprising:
an input stage comprising a first transistor and a second transistor connected in series to said first transistor, said first and second transistors being respectively controlled by an input voltage and a first control voltage for generating a drive voltage;
an amplification stage comprising
a first conduction path comprising an amplification transistor being controlled by the drive voltage, and a first load transistor connected in series to said amplification transistor and being controlled by a second control voltage,
a second conduction path comprising at least one second load transistor being controlled by a third control voltage,
a current mirror for forcing through said second conduction path a replica of current flowing through said first conduction path;
an output stage transistor for delivering an output current based on the input voltage, and being controlled by a voltage on said second load transistor; and
said first and second transistors, said amplification transistor, said first load transistor, said at least one second load transistor, and said output stage transistor each comprising a field effect transistor of a same conductivity type.

6. The Chua's circuit of claim 5, wherein said second load transistor comprises a diode-connected transistor.

7. The Chua's circuit of claim 5, wherein said second conduction path further comprises a third diode-connected load transistor connected in series to said second load transistor.

8. The Chua's circuit of claim 5, wherein each transistor comprises an organic P-type field effect transistor.

9. The Chua's circuit of claim 5, wherein said first and second transistors in said input stage are connected between positive and negative voltages; and wherein fixed levels of the first, second and third control voltages are established by connecting the respective terminals to the positive or negative voltage.

10. The Chua's circuit of claim 5, wherein said first and second transistors in said input stage are connected between positive and negative voltages; and further comprising voltage dividers comprising diode-connected transistors in series between the positive and negative voltages; and wherein fixed levels of the first, second and third control voltages are established by connecting respective terminals to output nodes of said voltage dividers.

11. A method for operating an analog transconductance amplifier comprising an input stage comprising a first transistor and a second transistor connected in series to the first transistor; an amplification stage connected to the input stage and comprising first and second conduction paths and a current mirror; and an output stage connected to the amplification stage, the method comprising:
connecting the first and second transistors of the input stage between positive and negative voltages, and generating a drive voltage by respectively controlling the first and second transistors using an input voltage and a first control voltage;
applying the drive voltage to the first conduction path, the first conduction path comprising an amplification transistor being controlled by the drive voltage, and a first load transistor connected in series to the amplification transistor and being controlled by a second control voltage;
applying a third control voltage to the second conduction path comprising at least one second load transistor for control thereof;
using the current mirror for forcing through the second conduction path a replica of current flowing through the first conduction path;
delivering an output current by the output stage based on the input voltage, the output stage comprising an output stage transistor being controlled by a voltage on the second load transistor; and
the first and second transistors, the amplification transistor, the first load transistor, the at least one second load transistor, and the output stage transistor each comprising a field effect transistor of a same conductivity type.

12. The method of claim 11, wherein the second load transistor comprises a diode-connected transistor.

13. The method of claim 11, wherein the second conduction path further comprises a third diode-connected load transistor connected in series to the second load transistor.

14. The method of claim 11, wherein each transistor comprises an organic P-type field effect transistor.

* * * * *